(12) United States Patent
Plihal et al.

(10) Patent No.: US 11,114,324 B2
(45) Date of Patent: Sep. 7, 2021

(54) DEFECT CANDIDATE GENERATION FOR INSPECTION

(71) Applicant: KLA Corporation, Milpitas, CA (US)

(72) Inventors: Martin Plihal, Pleasanton, CA (US); Erfan Soltanmohammadi, Felton, CA (US); Prasanti Uppaluri, Saratoga, CA (US); Mohit Jani, San Jose, CA (US); Chris Maher, San Jose, CA (US)

(73) Assignee: KLA Corp., Milpitas, CA (US)

( * ) Notice: Subject to any disclaimer, the term of this patent is extended or adjusted under 35 U.S.C. 154(b) by 0 days.

(21) Appl. No.: 16/653,939

(22) Filed: Oct. 15, 2019

(65) Prior Publication Data

US 2020/0328104 A1 Oct. 15, 2020

Related U.S. Application Data

(60) Provisional application No. 62/832,074, filed on Apr. 10, 2019.

(51) Int. Cl.
*H01L 21/67* (2006.01)
*G01N 21/88* (2006.01)
(Continued)

(52) U.S. Cl.
CPC ...... *H01L 21/67288* (2013.01); *G01N 21/8851* (2013.01); *G01N 21/9501* (2013.01); *G01N 21/956* (2013.01); *G03F 7/7065* (2013.01); *G06T 7/0004* (2013.01); *G06T 7/11* (2017.01); *H01J 37/222* (2013.01); *H01J 37/28* (2013.01); *G06T 2207/30148* (2013.01);
(Continued)

(58) Field of Classification Search
CPC .......... G01N 21/8851; G01N 21/9501; G01N 21/956; G03F 7/7065; G06T 7/0004; G06T 7/10; G06T 7/11; G06T 7/136; G06T 2207/30148; H01L 21/67288; H01J 37/222; H01J 37/28; H01J 2237/24475; H01J 2237/24578; H01J 2237/2817
USPC ................................ 356/237.2–237.5, 239.3
See application file for complete search history.

(56) References Cited

U.S. PATENT DOCUMENTS 7,570,796 B2 8/2009 Zafar et al.
7,676,077 B2 3/2010 Kulkarni et al.
(Continued)

FOREIGN PATENT DOCUMENTS

KR 10-2017-0005379 1/2017

OTHER PUBLICATIONS

International Search Report and Written Opinion for PCT/US2020/027345 dated Jul. 28, 2020.

*Primary Examiner* — Colin W Kreutzer
(74) *Attorney, Agent, or Firm* — Ann Marie Mewherter

(57) ABSTRACT

Systems and methods for detecting defect candidates on a specimen are provided. One method includes, after scanning of at least a majority of a specimen is completed, applying one or more segmentation methods to at least a substantial portion of output generated during the scanning thereby generating two or more segments of the output. The method also includes separately detecting outliers in the two or more segments of the output. In addition, the method includes detecting defect candidates on the specimen by applying one or more predetermined criteria to results of the separately detecting to thereby designate a portion of the detected outliers as the defect candidates.

22 Claims, 6 Drawing Sheets

(51) Int. Cl.

| | | |
|---|---|---|
| *G01N 21/95* | (2006.01) | |
| *G01N 21/956* | (2006.01) | |
| *H01J 37/28* | (2006.01) | |
| *G06T 7/00* | (2017.01) | |
| *G06T 7/11* | (2017.01) | |
| *H01J 37/22* | (2006.01) | |
| *G03F 7/20* | (2006.01) | |

(52) U.S. Cl.
CPC ............... *H01J 2237/24475* (2013.01); *H01J 2237/24578* (2013.01); *H01J 2237/2817* (2013.01)

(56) References Cited

U.S. PATENT DOCUMENTS

| | | |
|---|---|---|
| 8,000,922 B2 | 8/2011 | Chen et al. |
| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |
| 9,222,895 B2 | 12/2015 | Duffy et al. |
| 9,518,934 B2 | 12/2016 | Chen et al. |
| 2013/0035876 A1 | 2/2013 | Huang et al. |
| 2014/0301630 A1 | 10/2014 | Kulkarni et al. |
| 2015/0324965 A1* | 11/2015 | Kulkarni ................. G06F 30/30 382/144 |
| 2017/0323435 A1 | 11/2017 | Minekawa et al. |

\* cited by examiner

DEFECT CANDIDATE GENERATION FOR INSPECTION

BACKGROUND OF THE INVENTION

1. Field of the Invention

The present invention generally relates to systems and methods for detecting defect candidates on a specimen.

2. Description of the Related Art

The following description and examples are not admitted to be prior art by virtue of their inclusion in this section.

Many different types of inspection systems used in the semiconductor manufacturing arts have adjustable output acquisition e.g., data, signal, and/or image acquisition) and sensitivity (or defect detection) parameters such that different parameters can be used to detect different defects or avoid sources of unwanted (nuisance) events. Although an inspection system that has adjustable output acquisition and sensitivity parameters provides significant advantages to a semiconductor device manufacturer, these inspection systems are essentially useless if the incorrect output acquisition and sensitivity parameters are used for an inspection process. In addition, since the defects, process conditions, and noise on wafers and other specimens may vary dramatically (and since the characteristics of the wafers and other specimens themselves may vary dramatically), the best output acquisition and sensitivity parameters for detecting defects on a particular specimen may be difficult, if not impossible, to predict. Therefore, although using the correct output acquisition and sensitivity parameters will have a dramatic effect on the results of inspection, it is conceivable that many inspection processes are currently being performed with incorrect or non-optimized output acquisition and sensitivity parameters.

An optimal inspection recipe for a semiconductor layer should detect as many defects of interest (DOIs) as possible while maintaining a substantially low nuisance rate. Optimizing an inspection recipe generally involves tuning the parameters used in the recipe until the optimal result is achieved. The set of parameters to be tuned thus depends on the detection algorithm used. One best known method for recipe optimization is to run a substantially "hot" inspection (also called a "hot scan") thereby increasing the likelihood of detecting DOI but often at the expense of substantially high nuisance rates. In particular, running a "hot" inspection ensures that as many DOI as possible can be detected and used for inspection parameter tuning.

Discovering DOI on a specimen for the purpose of inspection recipe setup is therefore not a trivial task. For example, it can be difficult to ensure that examples are discovered for all possible DOIs while also being able to separate the DOIs from the immense number of nuisances that are detected due to the "hot" nature of the discovery process. As such, much work in the semiconductor arts has been done to try to find methods and systems for defect discovery that provide the best defect sample for inspection recipe tuning.

One common method used today for generating hot scans is a manual tuning of detection thresholds and nuisance filters. This is typically achieved in an unsupervised manner (i.e., without ground truth data from a scanning electron microscope (SEM) or other ground truth data generation method or system) through a sequence of wafer scans with increasing sample size (inspected area) to avoid blow ups of the number of defect candidates generated.

Another method is a one step tuning scan (OSTS), which is an automated and supervised method whose purpose is to produce inspection results with targeted defect counts and a diverse set of defect candidates suitable for discovery and recipe tuning. This method generally relies on a pre-scan, typically on a relatively small sample plan, whose purpose is to set detection thresholds for the full wafer scan to achieve the target defect count while distributing the defect candidates across sensitivity regions and gray level segments.

The currently available methods and systems for defect candidate discovery, however, have a number of disadvantages. For example, the obvious disadvantages of the manual method are it is (a) subjective, (b) tedious, and (c) heavily dependent on domain knowledge and expertise. The disadvantages of OSTS methods generally fall into three categories. For example, the defect count targets in the OSTS scan are frequently not met and deviations from the target count can be quite significant in both directions. In addition, even with a good defect count, OSTS scans can suffer from an inability to run sufficiently hot in all segments where real defects can occur and can be effectively separated from nuisances. Furthermore, the OSTS scans are only good for discovery. In this manner, detection thresholds must be tuned manually for production scans.

Accordingly, it would be advantageous to develop systems and methods for detecting defect candidates on a specimen that do not have one or more of the disadvantages described above.

SUMMARY OF THE INVENTION

The following description of various embodiments is not to be construed in any way as limiting the subject matter of the appended claims.

One embodiment relates to a system configured to detect defect candidates on a specimen. The system includes an inspection subsystem configured for scanning energy over a specimen, detecting energy from the specimen during the scanning, and generating output responsive to the detected energy. The system also includes a computer subsystem configured for, after the scanning of at least a majority of the specimen is completed, applying one or more segmentation methods to at least a substantial portion of the output generated during the scanning thereby generating two or more segments of the output. The computer subsystem is also configured for separately detecting outliers in the two or more segments of the output. In addition, the computer subsystem is configured for detecting defect candidates on the specimen by applying one or more predetermined criteria to results of the separately detecting to thereby designate a portion of the detected outliers as the defect candidates. The system may be further configured as described herein.

Another embodiment relates to a computer-implemented method for detecting defect candidates on a specimen. The method includes the applying step described above. The scanning is performed by an inspection subsystem that scans energy over the specimen, detects energy from the specimen during the scanning, and generates the output responsive to the detected energy. The method includes the separately detecting and detecting steps described above. The applying, separately detecting, and detecting steps are performed by a computer subsystem coupled to the inspection subsystem. Each of the steps of the method may be further performed as described herein. In addition, the method may include any other step(s) of any other method(s) described herein. Furthermore, the method may be performed by any of the systems described herein.

Another embodiment relates to a non-transitory computer-readable medium storing program instructions executable on a computer system for performing a computer-implemented method for detecting defect candidates on a specimen. The computer-implemented method includes the steps of the method described above. The applying, separately detecting, and detecting steps are performed by the computer system coupled to the inspection subsystem. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
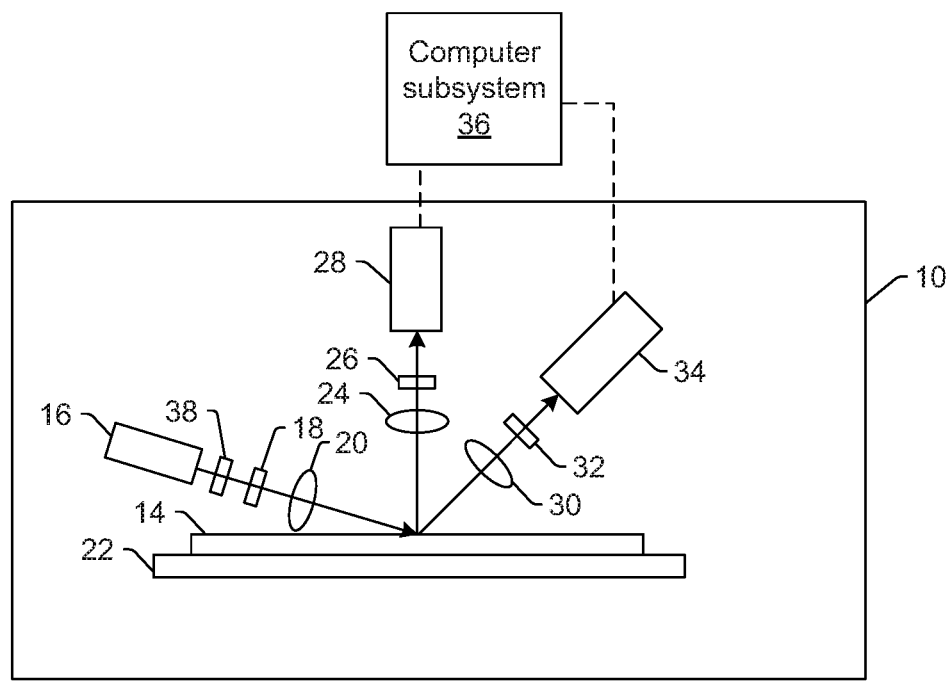
FIGS. 1-1a are schematic diagrams illustrating side views of embodiments of a system configured to detect defect candidates on a specimen.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information," as used interchangeably herein, generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkami et al., both of which are incorporated by reference as if fully set forth herein. In addition, the design data can be standard cell library data, integrated layout data, design data for one or more layers, derivatives of the design data, and full or partial chip design data.

In some instances, simulated or acquired images from a wafer or reticle can be used as a proxy for the design. Image analysis can also be used as a proxy for design data. For example, polygons in the design may be extracted from an image of a design printed on a wafer and/or reticle, assuming that the image of the wafer and/or reticle is acquired with sufficient resolution to adequately image the polygons of the design. In addition, the "design" and "design data" described herein refers to information and data that is generated by semiconductor device designers in a design process and is therefore available for use in the embodiments described herein well in advance of printing of the design on any physical wafers.

The "design" or "physical design" may also be the design as it would be ideally formed on the specimen. In this manner, a design described herein may not include features of the design that would not be printed on the specimen such as optical proximity correction (OPC) features in the case of a wafer, which are added to the design to enhance printing of the features on the wafer without actually being printed themselves.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to new methods and systems for defect candidate generation for inspection (e.g., broadband plasma (BBP) inspections, where the inspection is performed with a BBP light source, or other advanced inspection platforms). The embodiments introduce a novel methodology for generating defect candidates (i.e., "hot scans") for BBP (and other) inspection and offer an alternative approach to the currently used defect candidate generation paradigms in inspections. The embodiments do so by analyzing the nuisance characteristics that the inspected specimen generates in the inspection care areas and with the chosen optics mode(s). As described further herein, the embodiments advantageously can be used to (a) improve the detection capabilities of BBP and other inspection tools, (b) make tuning of BBP and other inspections significantly easier and less dependent on subjective judgments, (c) create uniform candidate-generation methods for discovery, tuning, and production scans, and (d) enable unique analysis of noise characteristics (during recipe tuning) that can be used for co-optimization of care area groups and optics modes. The embodiments described herein also are capable of performing unsupervised hot scans for better discovery and inspection.

"Nuisances" as that term is used herein are defects that a user does not care about and/or events that are detected by inspection but are not actually defects. Nuisances that are detected as events but are not actually defects may be detected due to non-defect noise sources on a specimen (e.g., line edge roughness (LER), relatively small critical dimension (CD) variation in patterned features, thickness variations, etc.) and/or due to marginalities in the inspection system itself or its configuration used for inspection. Generally, therefore, the goal of inspection is not to detect nuisances on specimens such as wafers.

"Care areas" as they are commonly referred to in the art are areas on a specimen that are of interest for inspection purposes. Sometimes, care areas are used to differentiate areas on the specimen that are inspected from areas on the specimen that are not inspected in an inspection process. In addition, care areas are sometimes used to differentiate between areas on the specimen that are to be inspected with one or more different parameters. For example, if a first area of a specimen is more critical than a second area on the specimen, the first area may be inspected with a higher sensitivity than the second area so that defects are detected in the first area with a higher sensitivity. Other parameters of an inspection process can be altered from care area to care area in a similar manner.

A "hot" threshold is generally defined as a threshold that is at, within, or substantially near the noise floor of the output generated by the inspection subsystem for the specimen. In this manner, the event detection can be quite a bit more aggressive (hotter) than would normally be performed for a tuned inspection recipe, so that more events, including defects and nuisance events, are detected than desired in a tuned inspection. A "hot" scan is a scan of a specimen in which events are detected using such a hot threshold. In this manner, such scans would not normally be useful for production monitoring due to the substantially high nuisance defect detection.

One embodiment relates to a system configured to detect defect candidates on a specimen, and one such system is shown in FIG. 1. The system includes an inspection subsystem configured for scanning energy over a specimen, detecting energy from the specimen during the scanning, and generating output responsive to the detected energy.

In one embodiment, the specimen is a wafer. The wafer may include any wafer known in the semiconductor arts. Although some embodiments may be described herein with respect to a wafer or wafers, the embodiments are not limited in the specimen for which they can be used. For example, the embodiments described herein may be used for specimens such as reticles, flat panels, personal computer (PC) boards, and other semiconductor specimens.

In one embodiment, the energy scanned over the specimen by the inspection subsystem includes light. For example, in the embodiment of the system shown in FIG. 1, inspection subsystem 10 includes an illumination subsystem configured to direct light to specimen 14. The illumination subsystem includes at least one light source. For example, as shown in FIG. 1, the illumination subsystem includes light source 16. In one embodiment, the illumination subsystem is configured to direct the light to the specimen at one or more angles of incidence, which may include one or more oblique angles and/or one or more normal angles. For example, as shown in FIG. 1, light from light source 16 is directed through optical element 18 and then lens 20 to specimen 14 at an oblique angle of incidence. The oblique angle of incidence may include any suitable oblique angle of incidence, which may vary depending on, for instance, characteristics of the specimen and the defects to be detected on the specimen.

The illumination subsystem may be configured to direct the light to the specimen at different angles of incidence at different times. For example, the inspection subsystem may be configured to alter one or more characteristics of one or more elements of the illumination subsystem such that the light can be directed to the specimen at an angle of incidence that is different than that shown in FIG. 1. In one such example, the inspection subsystem may be configured to move light source 16, optical element 18, and lens 20 such that the light is directed to the specimen at a different oblique angle of incidence or a normal (or near normal) angle of incidence.

In some instances, the illumination subsystem may be configured to direct light to the specimen at more than one angle of incidence at the same time. For example, the illumination subsystem may include more than one illumination channel, one of the illumination channels may include light source 16, optical element 18, and lens 20 as shown in FIG. 1 and another of the illumination channels (not shown) may include similar elements, which may be configured differently or the same, or may include at least a light source and possibly one or more other components such as those described further herein. If such light is directed to the specimen at the same time as the other light, one or more characteristics (e.g., wavelength, polarization, etc.) of the light directed to the specimen at different angles of incidence may be different such that light resulting from illumination of the specimen at the different angles of incidence can be discriminated from each other at the detector(s).

In another instance, the illumination subsystem may include only one light source (e.g., source 16 shown in FIG. 1) and light from the light source may be separated into different optical paths (e.g., based on wavelength, polarization, etc.) by one or more optical elements (not shown) of the illumination subsystem. Light in each of the different optical paths may then be directed to the specimen. Multiple illumination channels may be configured to direct light to the specimen at the same time or at different times (e.g., when different illumination channels are used to sequentially illuminate the specimen). In another instance, the same illumination channel may be configured to direct light to the specimen with different characteristics at different times. For example in some instances, optical element 18 may be configured as a spectral filter and the properties of the spectral filter can be changed in a variety of different ways (e.g., by swapping out the spectral filter) such that different wavelengths of light can be directed to the specimen at different times. The illumination subsystem may have any other suitable configuration known in the art for directing light having different or the same characteristics to the specimen at different or the same angles of incidence sequentially or simultaneously.

In one embodiment, light source 16 may include a BBP light source. In this manner, the light generated by the light source and directed to the specimen may include broadband light. However, the light source may include any other suitable light source such as any suitable laser known in the art and may be configured to generate light at any suitable wavelength(s) known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused onto specimen 14 by lens 20. Although lens 20 is shown in FIG. 1 as a single refractive optical element, in practice, lens 20 may include a number of refractive and/or reflective optical elements that in combination focus the light from the optical element to the specimen. The illumination subsystem shown in FIG. 1 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the inspection subsystem may be configured to alter one or more of the elements of the illumination subsystem based on the type of illumination to be used for inspection.

The inspection subsystem may also include a scanning subsystem configured to cause the light to be scanned over the specimen. For example, the inspection subsystem may include stage 22 on which specimen 14 is disposed during inspection. The scanning subsystem may include any suitable mechanical and/or robotic assembly (that includes stage 22) that can be configured to move the specimen such that the light can be scanned over the specimen. In addition, or alternatively, the inspection subsystem may be configured such that one or more optical elements of the inspection subsystem perform some scanning of the light over the specimen. The light may be scanned over the specimen in any suitable fashion such as in a serpentine-like path or in a spiral path.

The inspection subsystem further includes one or more detection channels. At least one of the one or more detection channels includes a detector configured to detect light from the specimen due to illumination of the specimen by the inspection subsystem and to generate output responsive to the detected light. For example, the inspection subsystem shown in FIG. 1 includes two detection channels, one formed by collector 24, element 26, and detector 28 and another formed by collector 30, element 32, and detector 34. As shown in FIG. 1, the two detection channels are configured to collect and detect light at different angles of collection. In some instances, both detection channels are configured to detect scattered light, and the detection channels are configured to detect light that is scattered at different angles from the specimen. However, one or more of the detection channels may be configured to detect another type of light from the specimen (e.g., reflected light).

As further shown in FIG. 1, both detection channels are shown positioned in the plane of the paper and the illumination subsystem is also shown positioned in the plane of the paper. Therefore, both detection channels are positioned in (e.g., centered in) the plane of incidence. However, one or more of the detection channels may be positioned out of the plane of incidence. For example, the detection channel formed by collector 30, element 32, and detector 34 may be configured to collect and detect light that is scattered out of the plane of incidence. Therefore, such a detection channel may be commonly referred to as a "side" channel, and such a side channel may be centered in a plane that is substantially perpendicular to the plane of incidence.

Although FIG. 1 shows an embodiment of the inspection subsystem that includes two detection channels, the inspection subsystem may include a different number of detection channels (e.g., only one detection channel or two or more detection channels). In one such instance, the detection channel formed by collector 30, element 32, and detector 34 may form one side channel as described above, and the inspection subsystem may include an additional detection channel (not shown) formed as another side channel that is positioned on the opposite side of the plane of incidence. Therefore, the inspection subsystem may include the detection channel that includes collector 24, element 26, and detector 28 and that is centered in the plane of incidence and configured to collect and detect light at scattering angle(s) that are at or close to normal to the specimen surface. This detection channel may therefore be commonly referred to as a "top" channel, and the inspection subsystem may also include two or more side channels configured as described above. As such, the inspection subsystem may include at least three channels (i.e., one top channel and two side channels), and each of the at least three channels has its own collector, each of which is configured to collect light at different scattering angles than each of the other collectors.

As described further above, each of the detection channels included in the inspection subsystem may be configured to detect scattered light, Therefore, the inspection subsystem shown in FIG. 1 may be configured for dark field (DF) inspection of specimens. However, the inspection subsystem may also or alternatively include detection channel(s) that are configured for bright field (BF) inspection of specimens. In other words, the inspection subsystem may include at least one detection channel that is configured to detect light specularly reflected from the specimen. Therefore, the inspection subsystems described herein may be configured for only DF, only BF, or both DF and BF inspection. Although each of the collectors are shown in FIG. 1 as single refractive optical elements, each of the collectors may include one or more refractive optical element(s) and/or one or more reflective optical element(s).

The one or more detection channels may include any suitable detectors known in the art such as photo-multiplier tubes (PMTs), charge coupled devices (CCDs), time delay integration (TDI) cameras, and any other suitable detectors known in the art. The detectors may also include non-imaging or imaging detectors. If the detectors are non-imaging detectors, the detectors may be configured to detect certain characteristics of the scattered light such as intensity but may not be configured to detect such characteristics as a function of position within the imaging plane. As such, the output that is generated by the detectors may be signals or data, but not image signals or image data. In such instances, a computer subsystem such as computer subsystem 36 of the system may be configured to generate images of the specimen from the non-imaging output of the detectors. However, in other instances, the detectors may be configured as imaging detectors that are configured to generate imaging signals or image data. Therefore, the system may be configured to generate images in a number of ways.

It is noted that FIG. 1 is provided herein to generally illustrate a configuration of an inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection system) such as the 29xx and 39xx series of tools that are commercially available from KLA. For some such systems, the methods described herein may be provided as optional functionality of the inspection system (e.g., in addition to other functionality of the inspection system). Alternatively, the inspection subsystem described herein may be designed "from scratch" to provide a completely new inspection system.

Computer subsystem 36 of the system may be coupled to the detectors of the inspection subsystem in any suitable manner (e.g., via one or more transmission media, which may include "wired" and/or "wireless" transmission media) such that the computer subsystem can receive the output generated by the detectors during scanning of the specimen. Computer subsystem 36 may be configured to perform a number of functions using the output of the detectors as described herein and any other functions described further herein. This computer subsystem may be further configured as described herein.

The computer subsystem of the system may also be referred to herein as a computer system. The computer subsystem or system may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

Although the inspection subsystem is described above as being an optical or light-based inspection subsystem, the inspection subsystem may be an electron beam-based subsystem. For example, in one embodiment, the energy scanned over the specimen by the inspection subsystem includes electrons. In one such embodiment shown in FIG. 1a, the system includes an inspection subsystem configured as electron column 122 coupled to computer subsystem 124.

Figure 1A:
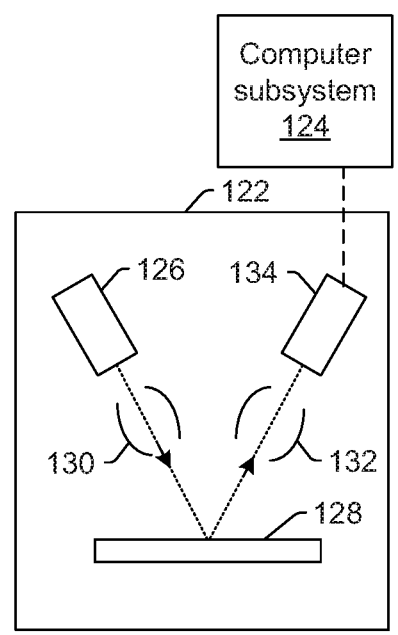

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, it is to be understood that the electron beam may be directed to and scattered from the specimen at any suitable angles. In addition, the electron beam inspection subsystem may be configured to use multiple modes to generate images of the specimen as described further herein (e.g., with different illumination angles, collection angles, etc.). The multiple modes of the electron beam inspection subsystem may be different in any image generation parameters of the inspection subsystem.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to perform functions for the specimen as described further herein using output generated by detector 134. Computer subsystem 124 may be configured to perform any additional step(s) described herein. A system that includes the inspection subsystem shown in FIG. 1a may be further configured as described herein.

It is noted that FIG. 1a is provided herein to generally illustrate a configuration of an electron beam inspection subsystem that may be included in the embodiments described herein. As with the optical inspection subsystem described above, the electron beam inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection subsystem) such as tools that are commercially available from KLA. For some such systems, the methods described herein may be provided as optional functionality of the system (e.g., in addition to other functionality of the system). Alternatively, the system described herein may be designed "from scratch" to provide a completely new system.

Although the inspection subsystem is described above as being a light- or electron beam-based inspection subsystem, the inspection subsystem may be an ion beam-based inspection subsystem. Such an inspection subsystem may be configured as shown in FIG. 1a except that the electron beam source may be replaced with any suitable ion beam source known in the art. In addition, the inspection subsystem may be any other suitable ion beam-based subsystem such as those included in commercially available focused ion beam (FIB) systems, helium ion microscopy (HIM) systems, and secondary ion mass spectroscopy (SIMS) systems.

As noted above, the inspection subsystem is configured for scanning energy light, electrons, etc.) over a physical version of the specimen thereby generating actual output or images for the physical version of the specimen. In this manner, the inspection subsystem may be configured as an "actual" tool, rather than a "virtual" tool. A storage medium (not shown), computer subsystem 36 shown in FIG. 1, and computer subsystem 124 shown in FIG. 1a may, however, be configured as a "virtual" tool. Systems and methods configured as "virtual" inspection tools are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents. For example, the one or more computer subsystems described herein may be further configured as described in these patents. Such computer subsystem configurations may be particularly suitable for the relatively large volume of data that may be generated and used in the embodiments described herein.

As further noted above, the inspection subsystem may be configured to generate output for the specimen with multiple modes. In general, a "mode" can be defined by the values of parameters of the inspection subsystem used for generating output (e.g., images) for a specimen. Therefore, modes that are different are defined by different values for at least one parameter of the inspection subsystem (other than position on the specimen at which the output is generated). For example, in an optical inspection subsystem, different modes may use at least one different wavelength of light for illumination. The modes may be different in the illumination wavelengths as described further herein (e.g., by using different light sources, different spectral filters, etc.) for different modes. In another example, different modes may use different illumination channels of the inspection subsystem. For example, as noted above, the inspection subsystem may include more than one illumination channel. As such, different illumination channels may be used for different modes. The modes may also or alternatively be different in one or more collection/detection parameters of the inspection subsystem. The inspection subsystem may be configured to scan the specimen with the different modes in the same scan or different scans, e.g., depending on the capability of using multiple modes to scan the specimen at the same time.

The computer subsystem included in the system (e.g., computer subsystem 36 and/or 124) is configured for, after the scanning of at least a majority of the specimen is completed, applying one or more segmentation methods to at least a substantial portion of the output generated during the scanning thereby generating two or more segments of the output. For example, one of the main enablers of the embodiments described herein is that they are designed to use substantially large amounts of data from "full wafer" scans that contain information about the nuisance the specimen generates for the given care area groups and optics modes. The segmentation may have multiple distinct levels to it, including any combination of one or more of the segmentation methods described herein (i.e., only one segmentation method, a combination of two segmentation methods, a combination of three segmentation methods, and so on). In addition, the embodiments described herein can be applied in many different use cases. There are many variants to achieving segmentation as described further herein, and the segmentation that is appropriate for the embodiments may vary depending on the use case for which they are implemented.

The phrase "at least a majority of the specimen" is used herein to mean all of the areas of the specimen that are scanned for defect detection (e.g., the inspected area of the specimen not necessarily including any area(s) on the specimen that are scanned during inspection for purposes other than defect detection (e.g., alignment)). In any given inspection process, the inspected area on a specimen may vary depending on the purpose of the inspection. In the embodiments described herein, "at least a majority of the specimen" will include more than 3 dies on the specimen and possibly all of the dies on the specimen. In addition, "at least a majority of the specimen" may include an entirety of the dies that are scanned on the specimen or only a significant portion of the dies that are scanned. In particular, since the embodiments described herein are particularly useful for discovering defects of interest (DOIs) and since the DOIs may theoretically be located in any die and any location within a die on the specimen, the "at least the majority of the specimen" may include all of the die areas on the specimen (or all of the device areas in the dies on the specimen). In this manner, the scanning that is performed for "at least the majority of the specimen" may be a "full wafer scan" or a "full specimen scan" although an entirety of the area of the specimen does not need to be scanned for the embodiments described herein. In this manner, the phrase "at least a majority of the specimen" as used herein is not intended to mean the scanning of only a single die, field, etc. on the specimen, scanning of only discrete areas on the specimen, or scanning of any other relatively small portion of the area of the specimen. The scanning of the at least a majority of the specimen that is performed before the segmentation step may otherwise be performed in any suitable manner by any of the inspection subsystems described herein.

Figure 2:
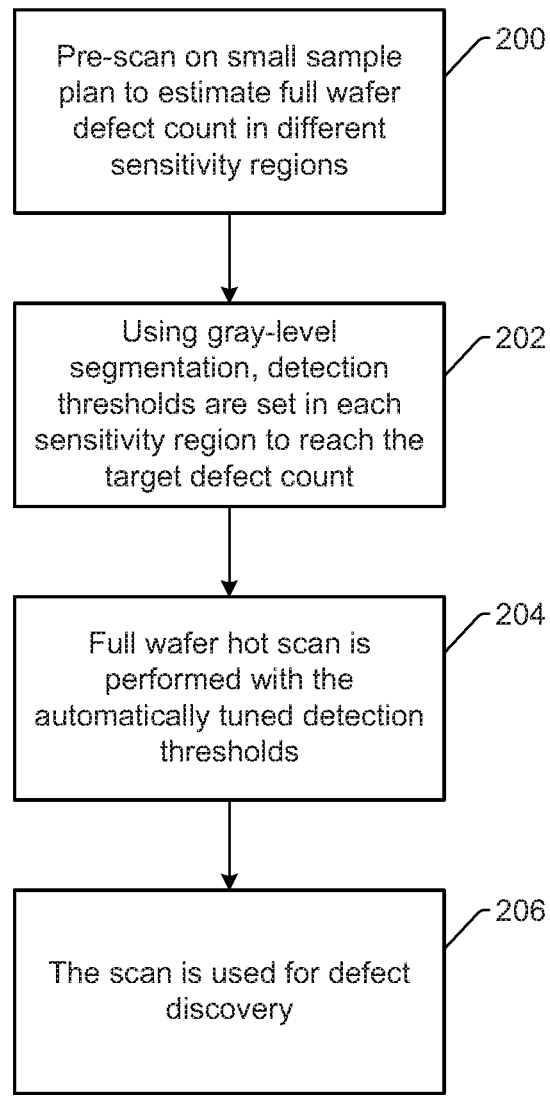
FIG. 2 is a flow chart illustrating one currently used method for discovering defects on a wafer.
Figure 3:
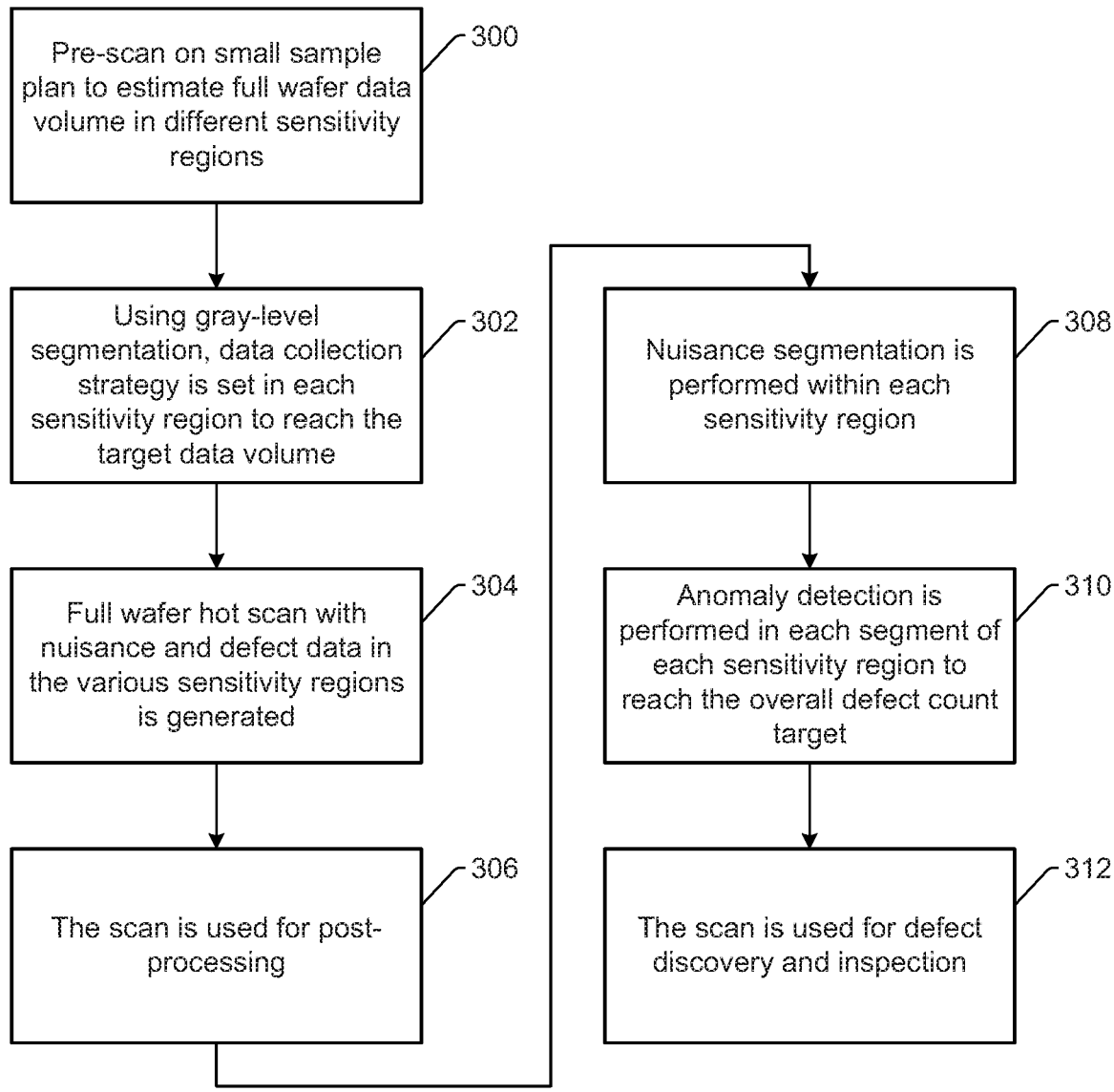
FIG. 3 is a flow chart illustrating one embodiment of steps that may be performed by the embodiments described herein for defect candidate detection.

FIGS. 2 and 3 illustrate some differences between the OSTS for discovery that may be performed by the embodiments described herein and other OSTS methods. For example, FIG. 3 shows steps that may be performed by the embodiments described herein. Steps 300, 302, 304, and 306 may be performed by the embodiments described herein prior to the applying step described above. As shown in step 300, the embodiments may perform a pre-scan on a (relatively) small sample plan to estimate full wafer data volume in different sensitivity regions (e.g., different care areas). The computer subsystem may cause the inspection subsystem to perform the pre-scan in any suitable manner, and the computer subsystem may estimate the full wafer data volume based on the output generated by the pre-scan in any suitable manner.

The different sensitivity regions (or different care areas) used by the embodiments described herein may be generated by the computer subsystem (e.g., using design data) in any suitable manner known in the art or they may be acquired by the computer subsystem from another method or system (not shown) such as an electronic design automation (EDA) tool that generated the different sensitivity regions.

Unlike this step, in other OSTS methods, a pre-scan may be performed on a small sample plan to estimate full wafer defect count in different sensitivity regions, as shown in step 200 of FIG. 2. Therefore, the present embodiments may use a pre-scan to estimate full wafer data volume, which is different from performing a pre-scan to estimate full wafer defect count. In particular, the full wafer data volume may include data for defects but also data for nuisances and other non-defects, but a full wafer defect count would estimate the number of only defects on the wafer.

As shown in step 302 of FIG. 3, in the embodiments described herein, using gray-level segmentation, a data collection strategy may be set in each sensitivity region to reach the target data volume. For example, the computer subsystem may apply gray-level segmentation to the different sensitivity regions and then divide the target data volume across gray level segments and the different sensitivity regions. The gray level segmentation may be performed in any manner known in the art. The target data volume may be divided equally across the gray level segments and different sensitivity regions or in any other suitable manner.

"Segments" can be generally defined as different portions of an entire range of possible values for pixels of the output. For instance, in the multi-die auto-thresholding (MDAT) algorithm, which is used by some wafer inspection systems commercially available from KLA, the value for the characteristic of the pixels that is used to define the segments (i.e., "segmentation values") may include median intensity value. In one such illustrative and non-limiting example, if the entire range of median intensity values is from 0 to 255, a first segment may include median intensity values from 0 to 100 and a second segment may include median intensity values from 101 to 255. In this manner, the first segment corresponds to darker areas in the output, and the second segment corresponds to brighter areas in the output.

In contrast, in other OSTS methods, using gray-level segmentation, detection thresholds are set in each sensitivity region to reach the target defect count, as shown in step 202 of FIG. 2. For example, the gray-level segmentation may be applied to different sensitivity regions and then the thresholds may be set in the different gray-level segments to reach the target defect count. Therefore, unlike other OSTS methods, the present embodiments may set a data collection strategy but not detection thresholds.

As shown in step 304 of FIG. 3, in the embodiments described herein, a full wafer hot scan with nuisance and defect data in the various sensitivity regions may be generated. The computer subsystem may cause the inspection subsystem to perform the full wafer hot scan to thereby generate the nuisance and defect data in the different sensitivity regions as described further herein. In contrast, in other OSTS methods, a full wafer hot scan is performed with the automatically tuned detection thresholds, as shown in step 204 of FIG. 2. Therefore, unlike other OSTS methods, the present embodiments may perform a full wafer hot scan but not with automatically tuned detection thresholds.

As shown in step 306 of FIG. 3, the scan may be used for post-processing in the embodiments described herein. For example, the results generated in the full wafer hot scan performed in step 304 may be used for the applying segmentation method(s) and other steps described herein. In one such example, as shown in step 308 of FIG. 3, in the embodiments described herein, nuisance segmentation may be performed within each sensitivity region. The segmentation performed in step 308 may include any of the segmentation method(s) described herein. In contrast, as shown in step 206 in FIG. 2, in other OSTS methods, the scan is used for defect discovery. The defect discovery that is performed in the other OSTS methods does not include the segmentation and other steps described further herein.

In one embodiment, at least one of the one or more segmentation methods is determined independent of the output generated during the scanning. For example, one of the segmentation method(s) may be determined based on only information that is available prior to the scanning of the specimen. Therefore, the segmentation may not be determined based on the output generated by scanning the specimen. The information that is available prior to the scanning of the specimen may include, for example, design information for the specimen, which may include any of the design information described further herein.

In some embodiments, at least one of the one or more segmentation methods is a design based segmentation method. Design based segmentation is deterministic and may come from care area groups generated from the design. The care area groups generated from the design may include any type of care areas and care area groups having any suitable characteristics. This segmentation level ties the nuisance mapping methodology described herein to care area optimization. Design based segmentation may also include context grouping using design, where areas of the design having similar background design information or "context" (e.g., the same type of patterned features) are grouped together. Design based segmentation may further include segmenting data using multi-layer information (i.e., information for multiple layers formed on the wafer, where one layer is formed on the wafer before another layer is formed on the wafer), incorporating noise from previous layers that may not be captured in the care area grouping.

In another embodiment, the computer subsystem is configured for determining at least one of the one or more segmentation methods based on the output generated during the scanning. For example, one of the segmentation method (s) may be determined based on information that is produced by scanning the specimen. Therefore, the segmentation may be determined based on the output generated by scanning the specimen. The information that is generated by scanning the specimen and that may be used for segmentation may include, for example, any characteristics of the output that can be determined by the computer subsystem and/or any characteristics of the specimen that can be determined from the output.

In a further embodiment, at least one of the one or more segmentation methods is an image based segmentation method. Image based segmentation may be created "on the fly" using the contextual information contained in the images around the detected candidates and separating contexts with different noise characteristics. Noise characteristics are defined by the distribution of nuisance events in the signal space. Image based segmentation may further include segmenting the output using multi-layer information (i.e., information for multiple layers formed on the wafer), incorporating noise from previous layers that may not be captured in the care area grouping.

In an additional embodiment, at least one of the one or more segmentation methods is a specimen based segmentation method. Specimen based segmentation may also be created "on the fly" by analyzing nuisance characteristics across the specimen, for example, in predetermined spatial zones on the specimen. The spatial zones on the specimen may or may not correspond to design information for the specimen (e.g., they may correspond to expected across specimen variations produced by one or more fabrication processes performed on the specimen prior to scanning, which may not correspond to dies or other patterned feature areas on the specimen). Specimen based segmentation may further include segmenting data using multi-layer information information for multiple layers formed on the wafer), incorporating noise from previous layers that may not be captured in the care area grouping.

The computer subsystem is also configured for separately detecting outliers in the two or more segments of the output. Therefore, the generation of the hot scan results includes two steps (a) segmentation of the nuisance (noise), and (b) outlier detection in each segment. For example, as shown in step 310 of FIG. 3, in the embodiments described herein, anomaly (outlier) detection may be performed in each segment of each sensitivity region to reach the overall defect count target. Although outlier detection may be performed in each segment of each sensitivity region, that is not necessary. For example, outlier detection may be performed in only a portion (not all/two or more) of the segments and/or in only a portion (not all/two or more) of the sensitivity regions.

The term "outlier" as used herein can be generally defined as an individual output (e.g., a pixel of output) that has a value that lies outside of (e.g., is much larger or smaller than) most (e.g., a majority, about 95%, etc.) of the values of others of the individual output. In this manner, by observing the overall distribution of the output values in any one segment, the outliers in that segment can be identified as the individual outputs having values outside of the overall distribution of all of the individual outputs. The outliers may be signal outliers in that they may be determined based on the values of signals of the output. However, the outliers may be determined using any other kinds of output or values determined from the raw output generated by the detector(s) of the inspection subsystem. For example, the outliers may be signal outliers, image data outliers, gray level outliers, intensity outliers, and the like.

In one embodiment, separately detecting the outliers includes analyzing a distribution of nuisances in a user-defined space defined by one or more values of the output generated for the specimen. For example, the anomaly detection in each segment (or two or more segments) may be performed by analyzing the nuisance distribution in a user-defined signal space. In one such example, the output generated in any one segment may be analyzed using any one or more characteristics of the output to identify the instances (e.g., pixels) of the output that are (or correspond to) outliers, and the one or more characteristics may be selected or defined by a user. In particular, nuisances and DOIs will usually produce output that has one or more different characteristics (e.g., gray level intensity) due to the differences on the specimen between nuisances and DOIs. In addition, the nuisances on the specimen will generally be much higher in number compared to any DOIs simply due to the nature of DOIs and nuisances (e.g., relatively small variations in the patterned features on the specimen will usually be relatively numerous and be detected as nuisances while DOIs may occur much less frequently on the specimen than nuisances). Therefore, by analyzing any one or more characteristics of the output (e.g., possibly in signal space defined by the user), the computer subsystem can identify which of the output instances are outliers compared to the other output instances.

The computer subsystem is further configured for detecting defect candidates on the specimen by applying one or more predetermined criteria to results of the separately detecting to thereby designate a portion of the detected outliers as the defect candidates. For example, as shown in step 312 of FIG. 3, in the embodiments described herein, the scan may be used for defect discovery and inspection. The embodiments described herein therefore reinvent the detection/filtering pipeline for inspection took such as BBP tools. For example, unlike most inspection methods that make decisions about defects while the specimen is being scanned, the embodiments described herein defer "detection" decisions until the "entire" specimen (i.e., "at least a majority of the specimen" as that term is defined herein) is scanned. In addition, the embodiments described herein redefine the detection and filtering paradigm on inspection tools such as BBP tools with the effect of increasing the effective sensitivity of the inspection to DOIs.

Figure 4:
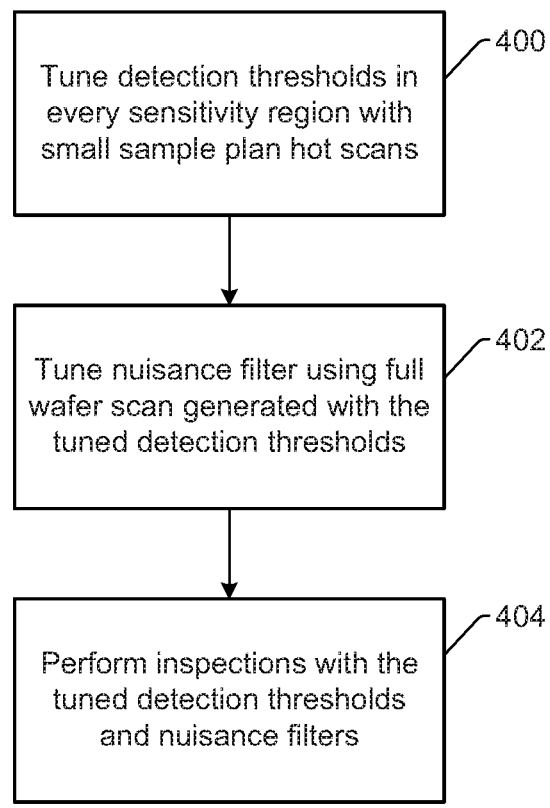
FIG. 4 is a flow chart illustrating one currently used method for the setup and run phases of an inspection process.
Figure 5:
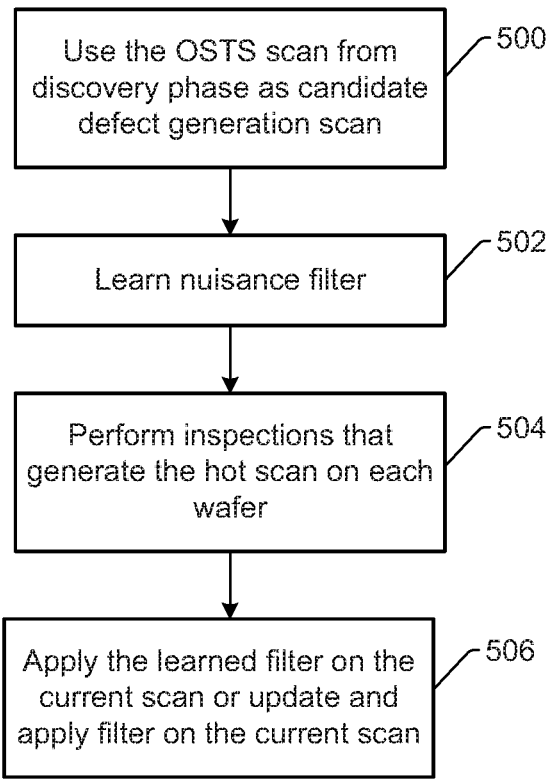
FIG. 5 is a flow chart illustrating one embodiment of steps that may be performed by the embodiments described herein for the setup and run phases of an inspection process.

FIGS. 4 and 5 illustrate some differences between the detection and filtering pipeline of BBP inspections that may be performed by the embodiments described herein and other inspection methods. For example, FIG. 5 shows steps that may be performed by the embodiments described herein. As shown in step 500 of FIG. 5, the embodiments described herein may use the OSTS scan from discovery phase as candidate defect generation scan. In other words, the scan from step 312 described above may be used as the candidate defect generation scan. As shown in step 502 of FIG. 5, the embodiments described herein may learn a nuisance filter, which may be performed in any suitable manner known in the art. Steps 500 and 502 may be performed in the setup phase. As further shown in step 504, the embodiments described herein may perform inspections that generate the hot scan on each wafer. The inspections may be performed as described herein. In addition, as shown in step 506, the embodiments may apply the learned filter on the current scan or update and apply the filter on the current scan, which may be performed in any suitable manner. Steps 504 and 506 may be performed in the inspection phase.

In contrast to the detection and filtering steps that may be performed by the embodiments described herein, during the setup phase, as shown in step 400 of FIG. 4, other methods for detecting and filtering may include tuning detection thresholds in every sensitivity region with small sample plan hot scans. In the setup phase, other methods for detecting and filtering may include tuning a nuisance filter using full wafer scan generated with the tuned detection thresholds, as shown in step 402 of FIG. 4. In the inspection phase, other methods for detecting and filtering may perform inspections with the tuned detection thresholds and nuisance filters, as shown in step 404 of FIG. 4. Therefore, the other methods for detecting and filtering include a number of steps (e.g., steps 400, 402, and 404) that are not performed by the present embodiments, and the present embodiments for detecting and filtering include steps that are not performed by other methods and systems for detecting and filtering.

In one embodiment, the one or more predetermined criteria include an overall target defect count. For example, the content of the final candidate hot scan results can be determined by specifying an overall target defect count. The overall target defect count may be determined by a user and/or in any suitable manner. The overall target defect count may be used to designate a portion of the outliers as the defect candidates as described further herein. In some instances, the outliers may be designated as defect candidates in descending order of a measure of the outlier nature of the output (e.g., so that the output instances that are the most outlying may be selected before other output instances).

In one such embodiment, the one or more predetermined criteria include a distribution of the overall target defect count over the two or more segments. For example, the content of the final candidate hot scan results can be determined by further specifying how the defect count should be distributed across the various segmentation levels. The distribution of the overall target defect count over the two or more segments may be determined in a variety of ways described further herein.

In one such embodiment, the computer subsystem is configured to determine the distribution algorithmically. For example, the content of the final candidate hot scan results can be determined by further specifying how the defect count should be distributed across the various segmentation levels, and the distribution can be determined algorithmically. In one such example, the content of the final candidate hot scan results can be determined algorithmically based on the results of the outlier detection step and/or without user input.

In another such embodiment, the distribution is an equal distribution of the overall target defect count over the two or more segments. For example, the content of the final candidate hot scan results can be determined by further specifying how the defect count should be distributed across the various segmentation levels, and the distribution can be set such that the candidate count is equal in each of the segments.

In an additional such embodiment, the distribution is proportional to a nuisance count in the two or more segments. For example, the content of the final candidate hot scan results can be determined by further specifying how the defect count should be distributed across the various segmentation levels, and the distribution can be set such that the candidate count is proportional to the nuisance count in it. In this manner, segments that have higher nuisance counts may be assigned a greater portion of the overall defect count compared to segments that have lower nuisance counts.

In some embodiments, the computer subsystem is configured for determining the one or more predetermined criteria by algorithmic detection of a nuisance floor edge. For example, the content of the final candidate hot scan results may be determined by relying on algorithmic detection of the nuisance floor edge. The algorithmic detection of the nuisance floor edge may be performed in any suitable manner known in the art.

In one such embodiment, the computer subsystem is configured for determining a threshold for detecting the nuisance floor edge. For example, a threshold may be specified for the nuisance floor edge detection. The threshold may be specified in any suitable manner known in the art.

In a further embodiment, parameters used for separately detecting the outliers and detecting the defect candidates are not tuned based on ground truth data. For example, one core aspect of the methodology described herein is to produce the candidate hot scan by post-processing the information in a fully unsupervised manner, i.e., without any need to obtain scanning electron microscope (SEM) ground truth data for tuning. In addition, the embodiments described herein have the ability to utilize full wafer data sufficiently deep into the noise floor to create candidate hot scan results without any supervision (SEM ground truth) and without any manual intervention. Furthermore, the embodiments described herein rely on segmentation that may be multi-layered and may be arrived at in a fully automated way without SEM ground truth. These capabilities enable deferring the "detection" decisions until the entire wafer is scanned.

In some embodiments, the specimen is produced by a production manufacturing process. For example, the detection thresholds obtained automatically for the candidate hot scans can be used on production scans as well. In other words, there is no need to tune detection thresholds at all. This is not true for currently used inspection methods and systems. For example, currently, the detection thresholds are tuned to get the candidate hot scan results, and then the detection thresholds can be used on production scans. In contrast, if currently used OSTS is performed, which tunes detection thresholds automatically, the thresholds have to be re-tuned for production scans because the OSTS generated thresholds cannot be used for production.

In another embodiment, the specimen is produced by a fabrication process performed on the specimen with one or more experimental parameters. For example, the embodiments described herein can be used dynamically on each wafer to stabilize inspection results in terms of defect count, and this capability can be used to enable monitoring of minority defect types in research and development situations, design of experiment (DOE) wafers specifically.

The embodiments described herein may be further configured as described in U.S. Pat. No. 9,518,934 issued Dec. 13, 2016 to Chen et al., which is incorporated by reference as if fully set forth herein. The methods and systems described in this patent were designed to address the shortcomings of OSTS scans by improving the defect segmentation and then performing outlier detection in a user-defined signal space in each segment. The core of the idea was to modify the pre-scan of traditional OSTS by introducing into its flow a decision tree that can produce defect segmentation using user-defined templates followed by auto-segmentation and producing outlier populations in each segment according to user-specified defect count allocations. The methods and systems described in this patent achieve some improvements in defect diversification, but fundamentally retain some of the disadvantages of OSTS. One reason for the weakness was the limited access to segmentation information during the pre-scan, but the most important disadvantage with respect to these methods and systems is the limitation of the methods to discovery scans.

The embodiments described herein have a number of advantages over the currently used methods and systems. For example, the embodiments described herein have reliability advantages. In one such example, the candidate hot scan results generated by the embodiments described herein have fully deterministic defect counts irrespective of the conditions on the specimen. The embodiments are thus robust and avoid the problems with current OSTS. In addition, the embodiments described herein have defect candidate hot scan quality advantages. For example, the defect candidates in the hot scan results generated by the embodiments described herein are guaranteed to have richer and more diverse sets of signal outliers.

The embodiments described herein also have stability advantages. For example, the embodiments described herein can be applied on each specimen, resulting in completely stable inspection results from the point of view of defect count. This feature can prove substantially useful for DOE (split lot) wafers where it is important to monitor minority defect types while suppressing counts of majority failure types. The embodiments described herein can manage the inspection results by reducing the counts of majority types if the counts become excessive while enabling the detection and monitoring of minority types that are of interest and are inaccessible using regular inspection methodology today.

The embodiments described herein have further advantages with regard to sensitivity. For example, the embodiments described herein make it possible to increase sensitivity of BBP and other inspection tools through massive segmentation of the full wafer inspection results to optimize the DOI content in the hot scan results. Furthermore, the embodiments have advantages in use from discovery to production scans. For example, unlike OSTS, the candidate hot scans described herein are not limited to discovery. Instead, they can be used throughout the recipe tuning flow, and they can be turned into a production scan without the need to tune detection thresholds. The embodiments described herein also have applicability advantages. For example, the applicability of the embodiments described herein is much wider than OSTS. In one such example, the embodiments described herein can be used in discovery and sensitivity tuning. The embodiments can also be used for DOE wafers as a stand alone inspection by dynamically finding segmentation and outliers up to a fixed count. The embodiments can also be used by learning the outlier detection on a training wafer, fixing the segmentation result and outlier thresholds, and applying it to subsequent wafers as a perpetual source of candidates for "supervised" nuisance filters.

Each of the embodiments of each of the systems described above may be combined together into one single embodiment.

Another embodiment relates to a computer-implemented method for detecting defect candidates on a specimen. The method includes, after scanning of at least a majority of a specimen is completed, applying one or more segmentation methods to at least a substantial portion of output generated during the scanning thereby generating two or more segments of the output. The scanning is performed by an inspection subsystem that scans energy over the specimen, detects energy from the specimen during the scanning, and generates the output responsive to the detected energy. The method also includes separately detecting outliers in the two or more segments of the output. In addition, the method includes detecting defect candidates on the specimen by applying one or more predetermined criteria to results of the separately detecting to thereby designate a portion of the detected outliers as the defect candidates. These steps are performed by a computer subsystem coupled to the inspection subsystem.

Each of the steps of the method may be performed as described further herein. The method may also include any other step(s) that can be performed by the inspection subsystem and/or computer subsystem(s) or system(s) described herein. In addition, the method described above may be performed by any of the system embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 6:
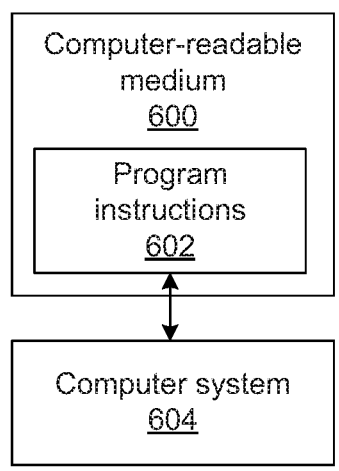
FIG. 6 is a block diagram illustrating one embodiment of a non-transitory computer-readable medium storing program instructions for causing a computer system to perform a computer-implemented method described herein.

Another embodiment relates to a non-transitory computer-readable medium storing program instructions executable on a computer system for performing a computer-implemented method for detecting defect candidates on a specimen. One such embodiment is shown in FIG. 6. For example, as shown in FIG. 6, non-transitory computer-readable medium 600 stores program instructions 602 executable on computer system 604 for performing a computer-implemented method for detecting defect candidates on a specimen. The computer-implemented method may include any step(s) of any method(s) described herein.

Program instructions 602 implementing methods such as those described herein may be stored on non-transitory computer-readable medium 600. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Computer system 604 may be further configured as described herein.

Further modifications and alternative embodiments of various aspects of the invention will be apparent to those skilled in the art in view of this description. For example, systems and methods for detecting defect candidates on a specimen are provided. Accordingly, this description is to be construed as illustrative only and for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to detect defect candidates on a specimen, comprising:
   an inspection subsystem configured for scanning energy over a specimen, detecting energy from the specimen during the scanning, and generating output responsive to the detected energy; and
   a computer subsystem configured for:
      after the scanning of at least a majority of the specimen is completed, applying one or more segmentation methods to at least a substantial portion of the output generated during the scanning thereby generating two or more segments of the output;
      separately detecting outliers in the two or more segments of the output; and
      detecting defect candidates on the specimen by applying one or more predetermined criteria to results of said separately detecting to thereby designate a portion of the detected outliers as the defect candidates.

2. The system of claim 1, wherein at least one of the one or more segmentation methods is determined independent of the output generated during the scanning.

3. The system of claim 1, wherein the computer subsystem is further configured for determining at least one of the one or more segmentation methods based on the output generated during the scanning.

4. The system of claim 1, wherein at least one of the one or more segmentation methods is a design based segmentation method.

5. The system of claim 1, wherein at least one of the one or more segmentation methods is an image based segmentation method.

6. The system of claim 1, wherein at least one of the one or more segmentation methods is a specimen based segmentation method.

7. The system of claim 1, wherein said separately detecting the outliers comprises analyzing a distribution of nuisances in a user-defined space defined by one or more values of the output generated for the specimen.

8. The system of claim 1, wherein the one or more predetermined criteria comprise an overall target defect count.

9. The system of claim 8, wherein the one or more predetermined criteria further comprise a distribution of the overall target defect count over the two or more segments.

10. The system of claim 9, wherein the computer subsystem is further configured to determine the distribution algorithmically.

11. The system of claim 9, wherein the distribution is an equal distribution of the overall target defect count over the two or more segments.

12. The system of claim 9, wherein the distribution is proportional to a nuisance count in the two or more segments.

13. The system of claim 1, wherein the computer subsystem is further configured for determining the one or more predetermined criteria by algorithmic detection of a nuisance floor edge.

14. The system of claim 13, wherein the computer subsystem is further configured for determining a threshold for detecting the nuisance floor edge.

15. The system of claim 1, wherein parameters used for said separately detecting and said detecting are not tuned based on ground truth data.

16. The system of claim 1, wherein the specimen is produced by a production manufacturing process.

17. The system of claim 1, wherein the specimen is produced by a fabrication process performed on the specimen with one or more experimental parameters.

18. The system of claim 1, wherein the energy scanned over the specimen by the inspection subsystem comprises light.

19. The system of claim 1, wherein the energy scanned over the specimen by the inspection subsystem comprises electrons.

20. The system of claim 1, wherein the specimen is a wafer.

21. A computer-implemented method for detecting defect candidates on a specimen, comprising:
   after scanning of at least a majority of a specimen is completed, applying one or more segmentation methods to at least a substantial portion of output generated during the scanning thereby generating two or more segments of the output, wherein the scanning is performed by an inspection subsystem that scans energy over the specimen, detects energy from the specimen during the scanning, and generates the output responsive to the detected energy;
   separately detecting outliers in the two or more segments of the output; and
   detecting defect candidates on the specimen by applying one or more predetermined criteria to results of said separately detecting to thereby designate a portion of the detected outliers as the defect candidates, wherein said applying, said separately detecting, and said detecting are performed by a computer subsystem coupled to the inspection subsystem.

22. A non-transitory computer-readable medium, storing program instructions executable on a computer system for performing a computer-implemented method for detecting defect candidates on a specimen, wherein the computer-implemented method comprises:
   after scanning of at least a majority of a specimen is completed, applying one or more segmentation methods to at least a substantial portion of output generated during the scanning thereby generating two or more segments of the output, wherein the scanning is performed by an inspection subsystem that scans energy over the specimen, detects energy from the specimen during the scanning, and generates the output responsive to the detected energy;
   separately detecting outliers in the two or more segments of the output; and
   detecting defect candidates on the specimen by applying one or more predetermined criteria to results of said separately detecting to thereby designate a portion of the detected outliers as the defect candidates, wherein said applying, said separately detecting, and said detecting are performed by the computer system coupled to the inspection subsystem.

* * * * *